(12) United States Patent
Rahman et al.

(10) Patent No.: US 9,274,426 B2
(45) Date of Patent: Mar. 1, 2016

(54) ANTIREFLECTIVE COATING COMPOSITIONS AND PROCESSES THEREOF

(71) Applicant: AZ ELECTRONIC MATERIALS (LUXEMBOURG) S.A.R.L., Somerville, NJ (US)

(72) Inventors: M. Dalil Rahman, Flemington, NJ (US); Takanori Kudo, Bedminster, NJ (US); Alberto D. Dioses, Doylestown, PA (US); Douglas McKenzie, Easton, PA (US); Clement Anyadiegwu, Parlin, NJ (US); Munirathna Padmanaban, Bridgewater, NJ (US); Salem K. Mullen, Florham Park, NJ (US)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

(21) Appl. No.: 14/295,656

(22) Filed: Jun. 4, 2014

(65) Prior Publication Data

US 2015/0309410 A1  Oct. 29, 2015

Related U.S. Application Data

(63) Continuation-in-part of application No. 14/264,766, filed on Apr. 29, 2014.

(51) Int. Cl.
*G03F 7/11* (2006.01)
*G03F 7/09* (2006.01)
*C09D 165/00* (2006.01)
(Continued)

(52) U.S. Cl.
CPC .............. *G03F 7/091* (2013.01); *C09D 165/00* (2013.01); *G03F 7/038* (2013.01); *G03F 7/0382* (2013.01); *G03F 7/094* (2013.01); *G03F 7/16* (2013.01); *G03F 7/168* (2013.01); *G03F 7/30* (2013.01); *C08G 2261/3142* (2013.01); *H01L 21/0276* (2013.01)

(58) Field of Classification Search
CPC .......................... C08G 2261/3142; G03F 7/091
See application file for complete search history.

(56) References Cited

U.S. PATENT DOCUMENTS 3,474,054 A   10/1969  White
4,200,729 A    4/1980  Calbo (Continued)

FOREIGN PATENT DOCUMENTS

EP              2743770 A1 *  6/2014
WO     WO 2013/024779 A1     2/2013
WO     WO 2013/047106 A1     4/2013

OTHER PUBLICATIONS

Machine Language English Abstract from Espacenet of WO 2013/024779 A1.

(Continued)

*Primary Examiner* — Cynthia Hamilton
(74) *Attorney, Agent, or Firm* — Mitchell Brustein

(57) ABSTRACT

The present invention relates to a novel absorbing antireflective coating composition comprising a novel crosslinkable polymer comprising at least one repeat unit (A) having structure (1), at least one repeat unit (B) having a structure (2), and at least one repeat unit (C) having structure (3)

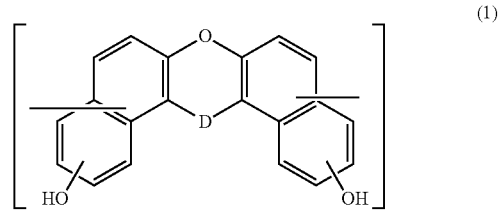

(1)

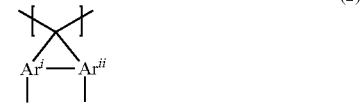

(2)

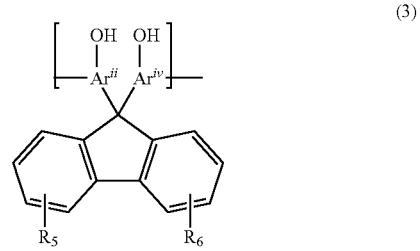

(3)

where D is a direct valence bound or $C(R_1)(R_2)$ methylene moiety where $R_1$ and $R_2$ are independently H, $C_1$-$C_8$ alkyl, $C_3$-$C_{24}$ cycloalkyl or $C_6$-$C_{24}$ aryl; $Ar^i$, $Ar^{ii}$, $Ar^{iii}$ and $Ar^{iv}$ are independently phenylenic and naphthalenic moiety, $R_3$ and $R_4$ are independently hydrogen or $C_1$-$C_8$ alkyl; and $R_5$ and $R_6$ are independently hydrogen or $C_1$-$C_8$ alkyl; and a solvent. The invention also relates to a process for forming an image using the novel antireflective coating composition.

20 Claims, 1 Drawing Sheet

(51) Int. Cl.
*G03F 7/16* (2006.01)
*G03F 7/30* (2006.01)
*G03F 7/038* (2006.01)
*H01L 21/027* (2006.01)

(56) References Cited

U.S. PATENT DOCUMENTS

| | | |
|---|---|---|
| 4,251,665 A | 2/1981 | Calbo |
| 4,491,628 A | 1/1985 | Ito et al. |
| 5,187,019 A | 2/1993 | Calbo et al. |
| 5,350,660 A | 9/1994 | Urano et al. |
| 5,843,624 A | 12/1998 | Houihan et al. |
| 6,447,980 B1 | 9/2002 | Rahman et al. |
| 6,723,488 B2 | 4/2004 | Kudo et al. |
| 6,790,587 B1 | 9/2004 | Feiring et al. |
| 6,818,258 B2 | 11/2004 | Kaneko et al. |
| 6,849,377 B2 | 2/2005 | Feiring et al. |
| 6,866,984 B2 | 3/2005 | Jung et al. |
| 6,916,590 B2 | 7/2005 | Kaneko et al. |
| 7,691,556 B2 | 4/2010 | Wu et al. |
| 2008/0305441 A1 | 12/2008 | Yoon et al. |
| 2011/0311920 A1 | 12/2011 | Kinsho et al. |
| 2012/0064725 A1 | 3/2012 | Kinsho et al. |
| 2014/0246400 A1* | 9/2014 | Higashihara et al. .......... 216/47 |
| 2014/0370444 A1 | 12/2014 | Rahman et al. |

OTHER PUBLICATIONS

Machine Language English Abstract from Espacenet of WO 2013/047106 A1.

Echigo et al., "Development of new xanthendiol derivatives applied to the negative-tone molecular resists for EB/EUVL", SPIE vol. 8682, No. 86821V, pp. 86821V-1-pp. 86821V-8 (2013).

Office Action notification date Mar. 30, 2015 for U.S. Appl. No. 14/264,766.

\* cited by examiner

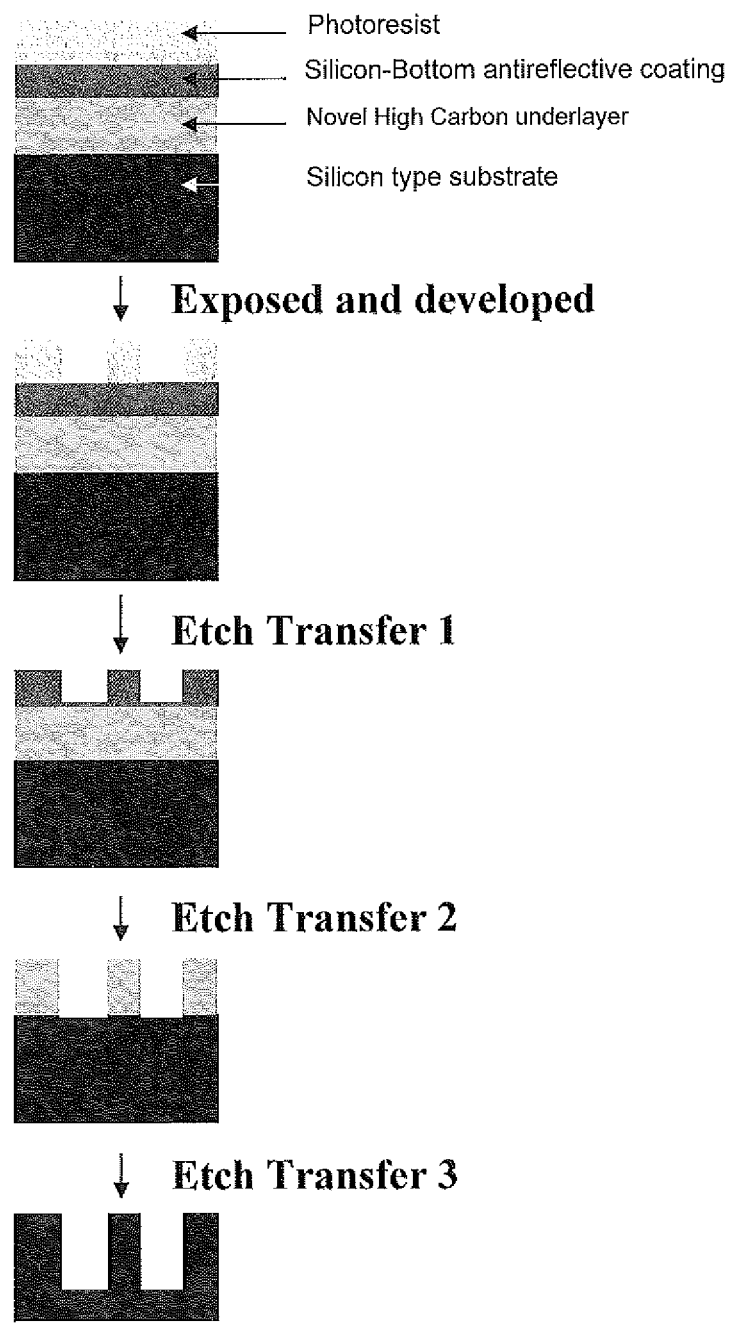
Imaging Process of a Trilayer

ANTIREFLECTIVE COATING COMPOSITIONS AND PROCESSES THEREOF

CROSS-REFERENCE TO RELATED APPLICATION

This application is a continuation-in-part application of Ser. No. 14/264,766 filed Apr. 29, 2014 the contents of which are hereby incorporated herein by reference.

DESCRIPTION

The present invention relates to a novel absorbing high carbon hard mask antireflective coating composition comprising at least one polymer capable of crosslinking and the invention also relates to a process for imaging a photoresist layer coated above the novel antireflective coating layer.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Absorbing antireflective coatings and underlayers in photolithography are used to diminish problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes or interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete photoresist loss. An antireflective coating coated beneath a photoresist and above a reflective substrate provides significant improvement in lithographic performance of the photoresist. Typically, the bottom antireflective coating is applied on the substrate and then a layer of photoresist is applied on top of the antireflective coating. The antireflective coating is cured to prevent intermixing between the antireflective coating and the photoresist. The photoresist is exposed imagewise and developed. The antireflective coating in the exposed area is then typically dry etched using various etching gases, and the photoresist pattern is thus transferred to the substrate. Multiple antireflective layers and underlayers are being used in new lithographic techniques. In cases where the photoresist does not provide sufficient dry etch resistance, underlayers or antireflective coatings for the photoresist that act as a hard mask and are highly etch resistant during substrate etching are preferred, and one approach has been to incorporate silicon into a layer beneath the organic photoresist layer. Additionally, another high carbon content antireflective or mask layer is added beneath the silicon antireflective layer, which is used to improve the lithographic performance of the imaging process. The silicon layer may be spin coatable or deposited by chemical vapor deposition. Silicon is highly etch resistant in processes where $O_2$ etching is used, and by providing an organic mask layer with high carbon content beneath the silicon antireflective layer, a very large aspect ratio can be obtained. Thus, the organic high carbon mask layer can be much thicker than the photoresist or silicon layer above it. The organic mask layer can be used as a thicker film and can provide better substrate etch masking that the original photoresist.

The present invention relates to a novel organic spin coatable antireflective coating composition or organic mask underlayer which has high carbon content, and can be used between a photoresist layer and the substrate as a single layer or one of multiple layers. Typically, the novel composition can be used as a spin on carbon hard mask to form a layer beneath an essentially etch resistant antireflective coating layer, such as a silicon antireflective coating. The high carbon content in the novel antireflective coating, also known as a carbon hard mask underlayer, allows for a high resolution image transfer with high aspect ratio. The novel composition is useful for imaging photoresists, and also for etching the substrate. The novel composition enables a good image transfer from the photoresist to the substrate, and also reduces reflections and enhances pattern transfer. Additionally, substantially no intermixing is present between the antireflective coating and the film coated above it. The antireflective coating also has good solution stability and forms films with good coating quality, the latter being particularly advantageous for lithography.

The present invention also relates to the use of this antireflective coating for filling open topographical features present in patterned substrate materials, such as vias, trenches, contact holes or other similar features which consist of open spaces within a photoresist pattern, patterned semiconductor, or patterned oxide surface. For instance, in this process a photoresist pattern containing such features such as trenches and/or vias is coated with the via filling antireflective coating, thus filling in the trenches and/or vias. This filling will reduce undesirable reflections originating from the underlying topography of the patterned substrate which may have deleterious effect on the imaging of a photoresist coated above the antireflective coating.

The novel antireflective coating composition of the present invention provides for improved solubility and coating uniformity when using the novel polymer of the invention while maintaining other lithographic properties such as high carbon content, low weight loss (as detected by thermogravimetric analysis), and adequate via filling and plasma etch rate.

SUMMARY OF THE INVENTION

The present invention relates to a novel absorbing antireflective coating composition which is also a spinable carbon hard mask comprising a novel polymer capable of being crosslinked and a solvent, where the novel polymer comprises at least one repeat unit (A) having structure (1), at least one repeat unit (B) having a structure (2), and at least one repeat unit (C) having structure (3);

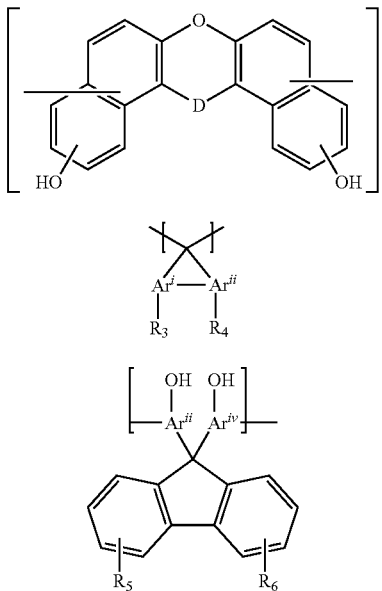

where D is a direct valence bound or a $C(R_1)(R_2)$ methylene moiety, where $R_1$ and $R_2$ are independently H, $C_1$-$C_8$ alkyl, $C_3$-$C_{24}$ cycloalkyl or $C_6$-$C_{24}$ aryl; $Ar^i$, $Ar^{ii}$, $Ar^{iii}$ and $Ar^{iv}$ are independently phenylenic or naphthalenic moiety; $R_3$ and $R_4$ are independently hydrogen, $C_1$-$C_8$ alkyl or $C_1$-$C_8$ alkoxy, and $R_5$ and $R_6$ are independently hydrogen, $C_1$-$C_8$ alkyl or $C_1$-$C_8$ alkoxy.

This invention also relates to a process for forming an image using the novel antireflective coating composition and filling material. The process is especially useful for imaging photoresists using radiation in the deep and extreme ultraviolet (uv) region.

BRIEF DESCRIPTION OF DRAWINGS

FIG. 1 illustrates a process of imaging.

DETAILED DESCRIPTION OF THE INVENTION

The following definition applies, unless a more specific definition is described in the text. Aryl or aromatic groups contain 6 to 24 carbon atoms including phenyl, tolyl, xylyl, naphthyl, anthracyl, pyrenyl, biphenyls, bis-phenyls, tris-phenyls and the like. These aryl groups may further be substituted with substituents such as hydroxyl, $C_1$-$C_8$ alkyl, or $C_1$-$C_8$ alkoxy. Similarly, cycloalkyl denotes cyclic saturated alkyl moieties containing 3-24 carbons such as cyclopropyl, cyclopentyl, cyclohexyl, cycloheptyl, cyclooctyl and the like. These cyclic groups may further be substituted with $C_1$-$C_4$ alkyl, or $C_1$-$C_4$ alkoxy moieties. The terms "phenylenic" and "naphthalenic" denotes multivalent moieties which are derived respectively from benzene or naphthalene which are part of a repeat unit which may have 3 or more sites of functionalization where these sites of functionalization may be the attachment point incorporating these moieties in a cyclic structure, the attachment points of another repeat unit, or a substituent as denoted in the following text and structures.

The novel antireflective composition of the present invention comprises a novel polymer with high carbon content which is capable of crosslinking, such that the coating, formed from the composition after crosslinking, becomes insoluble in the solvent of the material coated above it. The novel coating composition is capable of self-crosslinking or may additionally comprise a crosslinking compound capable of crosslinking with the polymer. The composition may additionally comprise other additives, such as organic acids, esters, organic alcohol compounds, thermal acid generators, photoacid generators, surfactants, other high carbon content polymers etc. The composition may comprise additional polymers, especially those with high carbon content.

The solid components of the novel composition are dissolved in an organic coating solvent composition, comprising one or more organic solvents. The novel polymer is soluble in the organic coating solvent(s).

The present invention relates to a novel absorbing antireflective coating composition which is also can be a spinable carbon hard mask comprising a novel polymer capable of being crosslinked, where the novel polymer comprises at least one repeat unit (A) having structure (1), at least one repeat unit (B) having a structure (2), and at least one repeat unit (C) having structure (3);

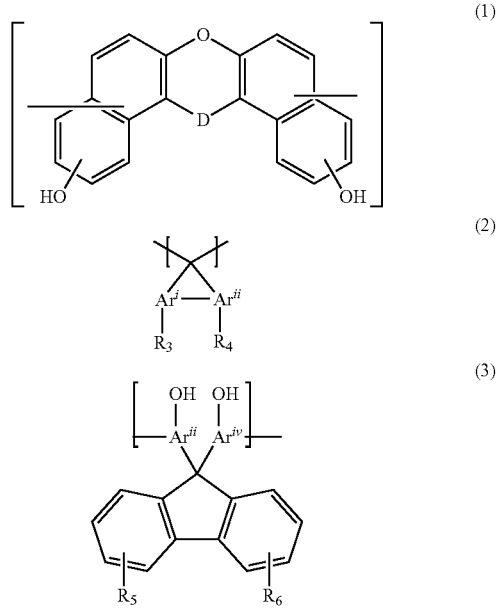

where D is a direct valence bound or a $C(R_1)(R_2)$ methylene moiety and where $R_1$ and $R_2$ are independently H, $C_1$-$C_8$ alkyl, $C_3$-$C_{24}$ cycloalkyl or $C_6$-$C_{24}$ aryl; $Ar^i$, $Ar^{ii}$, $Ar^{iii}$ and $Ar^{iv}$ are independently phenylenic or naphthalenic multivalent moieties derived respectively from benzene or naphthalene, $R_3$ and $R_4$ are independently hydrogen, $C_1$-$C_8$ alkyl or $C_1$-$C_8$ alkoxy, $R_5$ and $R_6$ are independently hydrogen, $C_1$-$C_8$ alkyl or $C_1$-$C_8$ alkoxy; and a solvent.

The novel polymer may be obtained by the condensation reaction of a monomer (Ia), with a monomer (2a) and monomer (3a) in the presence of an acid catalyst in a solvent;

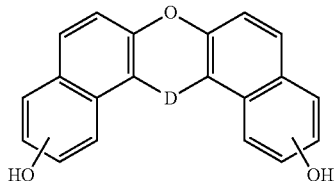

(1a)

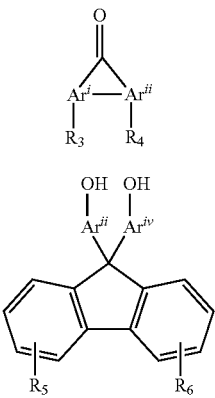

(2a)

(3a)

where D is a direct valence bound or a $C(R_1)(R_2)$ methylene moiety and where $R_1$ and $R_2$ are independently H, $C_1$-$C_8$ alkyl, $C_3$-$C_{24}$ cycloalkyl or $C_6$-$C_{24}$ aryl; $Ar^i$, $Ar^{ii}$, $Ar^{iii}$ and $Ar^{iv}$ are independently phenylenic or naphthalenic moiety, $R_3$ and $R_4$ are independently hydrogen, $C_1$-$C_8$ alkyl or $C_1$-$C_8$ alkoxy; and, $R_5$ and $R_6$ are independently hydrogen, $C_1$-$C_8$ alkyl or $C_1$-$C_8$ alkoxy. The monomer structure (1a) has two phenolic site for electrophilic attack as does the monomer structure (3a); the monomer (2a) has a carbonyl group which when protonated by a strong acid forms an electrophile which can electrophilically attack structures 1a or 2a to result in the repeat units A, B, and C having structures (1), (2) and (3) respectively.

The novel polymer, unexpectedly, and simultaneously, possesses several desirable properties as follows:
(a) a good solubility in spin coating solvent coupled with good film forming ability;
(b) the ability to undergo crosslinking with or without an optional crosslinker additive or optional thermal acid generator so as to allow the overcoating of a photoresist material on top of the high carbon underlayer without intermixing of the two layers;
(c) good optical properties (i.e. refractive index and extinction coefficient) for forming effective bottom antireflective coatings, when overcoated with a photoresist and exposed to radiation, such as deep or extreme UV radiation;
(d) very low outgassing, so that undesirable deposition of material inside processing track does not occur during baking;
(e) ability to fill topography such as Vias, Trenches, Contact Holes, etc. on patterned substrates on which the novel composition is coated and to also planarize this patterned substrate.
(f) high carbon content which leads to desirable plasma etching properties facilitating pattern transfer to the substrate during plasma etching; and,
(g) ability to incorporate the free monomer of structure 1a as an optional additive into the formulation (up to 70% by dry weight of polymer and monomer) without negatively impacting any of the above described properties while improving planarization when coated on patterned substrates.

Non-limiting, more specific examples of repeat unit A is shown in structure 1a1 and 1a2 derived from monomers having structure 1a3 and 1a4 respectively, wherein D is defined as above.

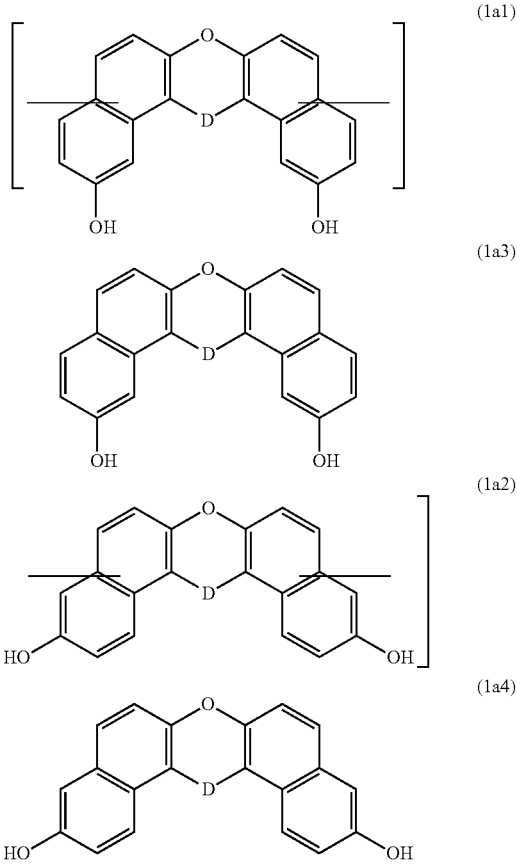

A more specific, non-limiting example of repeat unit A is shown in structure 1b derived from monomers having structure 1b1, wherein $R_1$ and $R_2$ are independently H, $C_1$-$C_8$ alkyl, $C_3$-$C_{24}$ cycloalkyl or $C_6$-$C_{24}$ aryl.

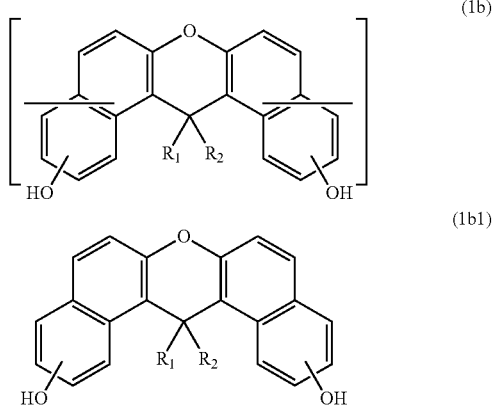

Specific, non-limiting examples of repeat unit A can also be chosen from ones having structure (1b2) or structure (1b3) derived from monomers having structures (1b4) or (1b5) respectively wherein $R_1$ and $R_2$ are as defined above.

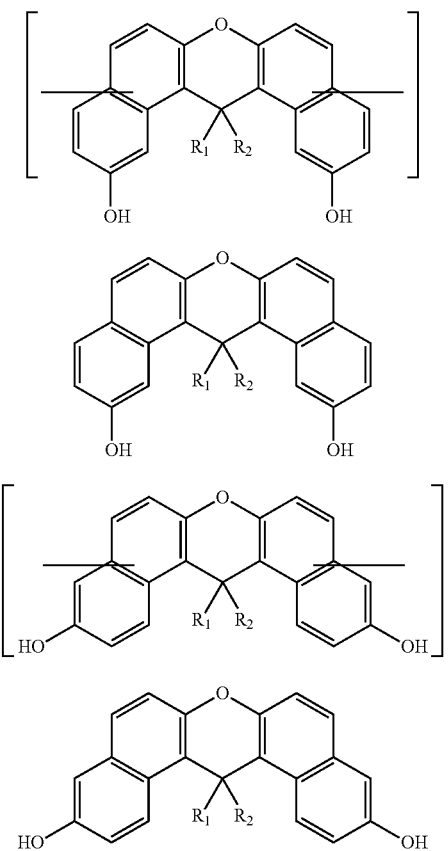

(1b1)

(1b4)

(1b3)

(1b5)

As another, non-limiting examples of repeat unit A, the unit can have structure 4 which is derived by polymerization of a monomer having structure 4a, wherein $R_7$ is a $C_6$-$C_{24}$ aryl.

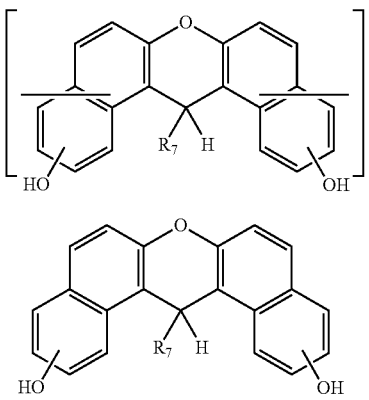

(4)

(4a)

A further example of non-limiting structures of repeat unit A, are ones having structure 4b or 4c, which are derived by polymerization of monomers having respective structures 4d or 4e, wherein $R_7$ is as defined above.

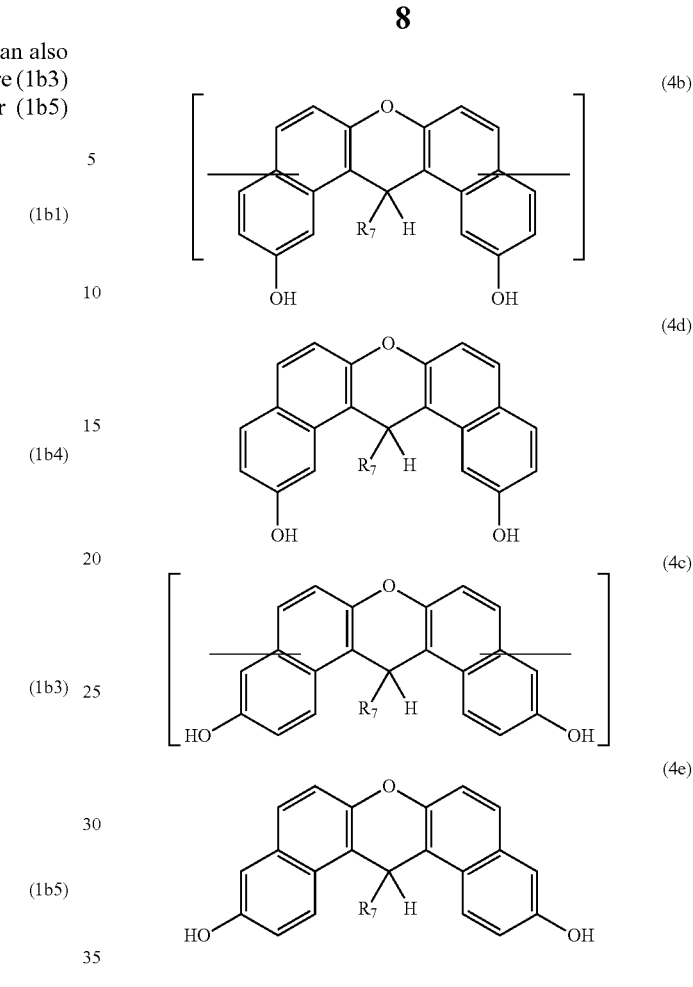

(4b)

(4d)

(4c)

(4e)

Structures 1C1 to 1D11 show non limiting examples of monomers having structure 1a, which can either be used to create repeat unit A having general structure (1) in the novel polymer, or are useful as optional additive to improve planarization when the novel polymer of this invention is coated.

In other non-limiting examples of a repeat unit A, the unit can have structure 5, or 5a which are derived by polymerization of a monomer having structure (5b1) [14-[1,1'-biphenyl]-4-yl-14H-Dibenzo[a,j]xanthene-2,12-diol (2,12-DBDX), or (5b2) [14-[1,1'-biphenyl]-4-yl-14H-Dibenzo[a,j]xanthene-3,11-diol (3,11-DBDX)]. Either 2,12-DBDX or 3,11-DBDX or mixtures of these may be used as additives to improve planarization when formulated with the novel polymer of this invention.

The different structures for repeat unit A described herein may also be present as mixtures of different structures in the novel polymer of this invention comprised of repeat units A, B and C.

The monomer structures from which repeats unit A may be derived, as described above, may also be used in non-polymerized form as an additives to improve planarization when the novel composition comprised of the novel polymer of this invention is used to form a coating. It is also anticipated that mixtures of two or more monomers of this type having different structures could also be employed as additives to improve planarization.

1C1
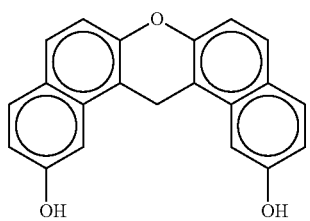
1C2
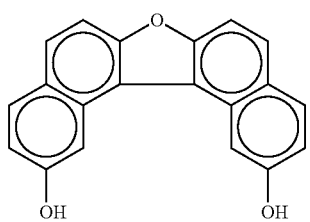
1C3
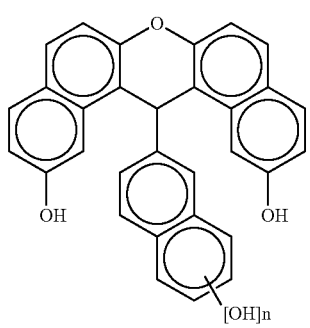
n = 1 to 5
1C4
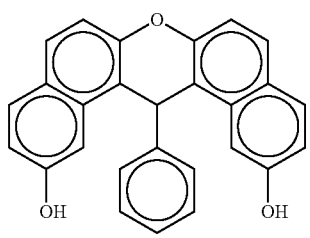
1C5
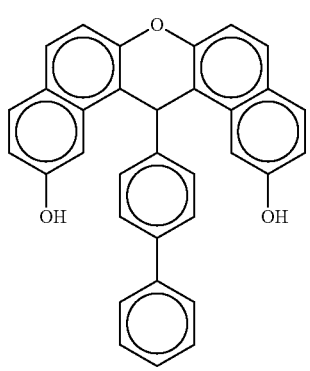
-continued
1C6
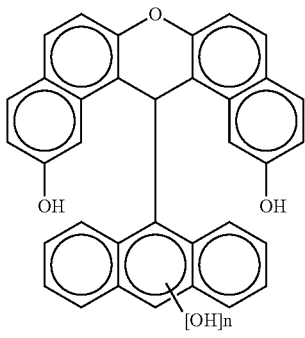
n = 0 to 9
1C7
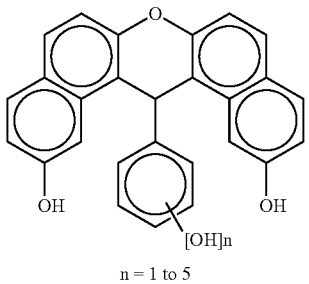
n = 1 to 5
1C8
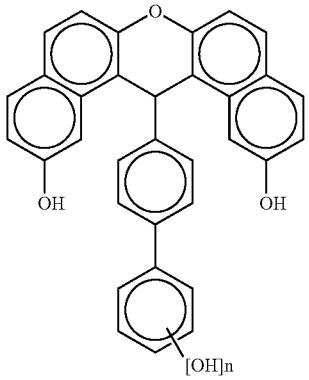
n = 1 to 5
1C9
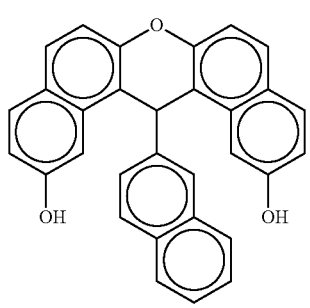

-continued
1C10
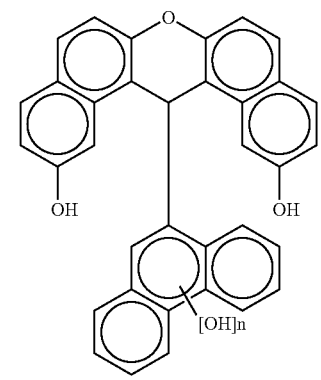
n = 0 to 9
1C11
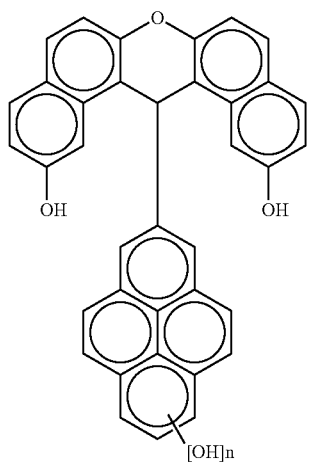
n = 0 to 9
1D1
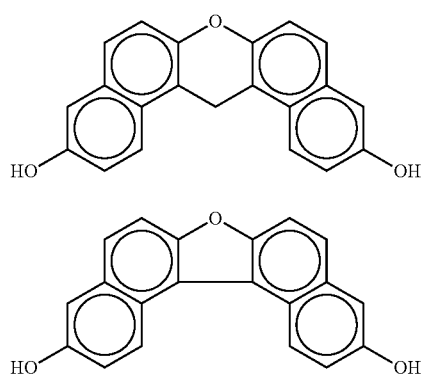
1D2
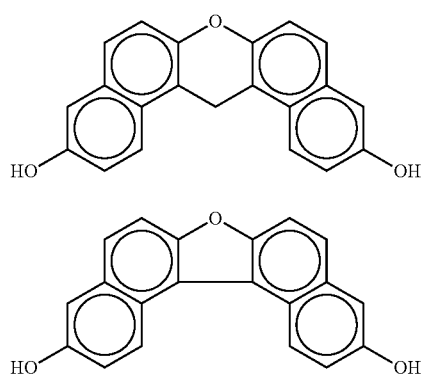
1D3
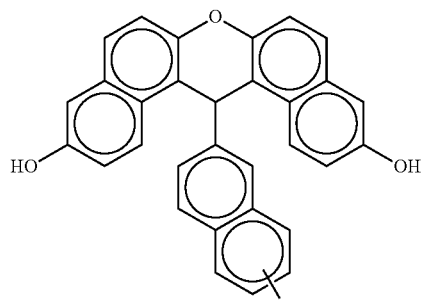
n = 1 to 5
-continued
1D4
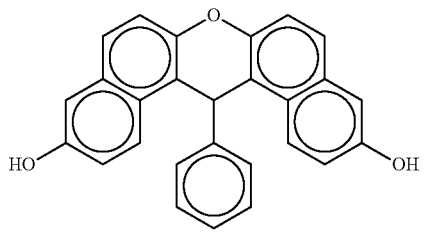
1D5
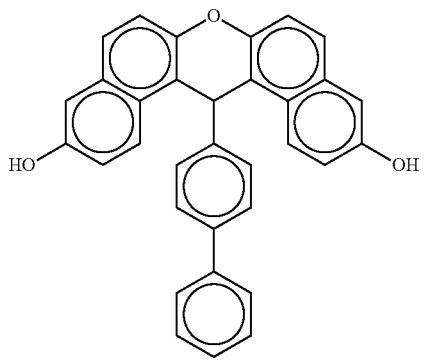
1D6
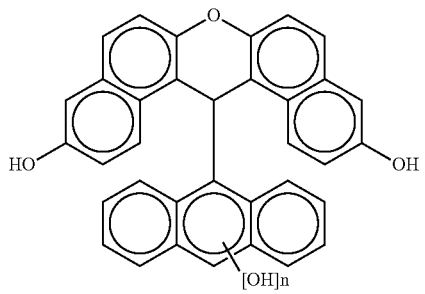
n = 0 to 9
1D7
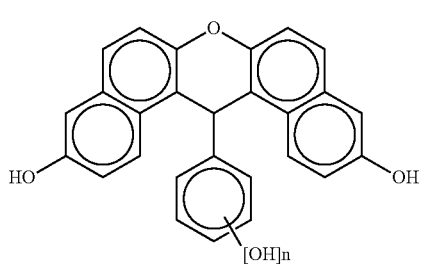
n = 1 to 5
1D8
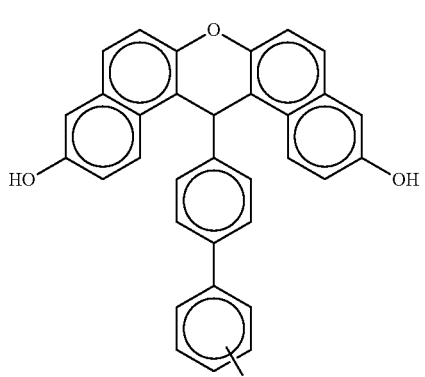
n = 1 to 5

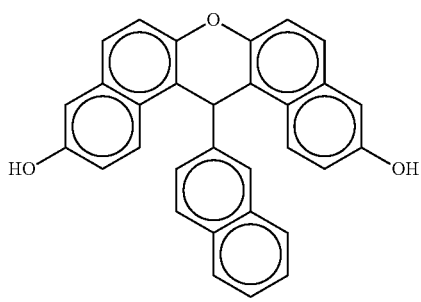
1D9
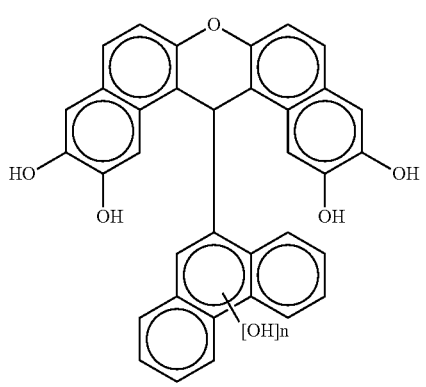
1D10
n = 0 to 9
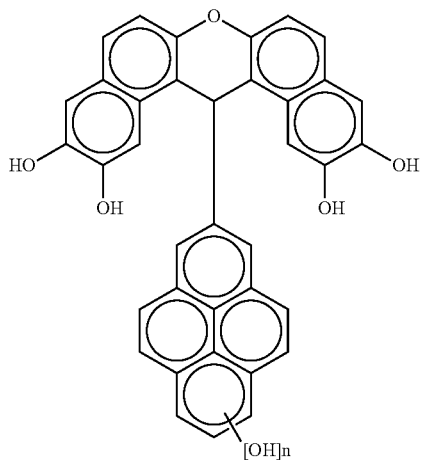
1D11
n = 0 to 9
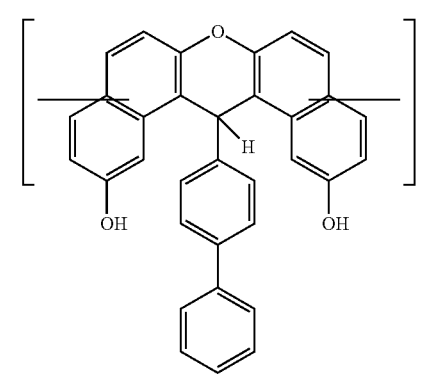
(5)
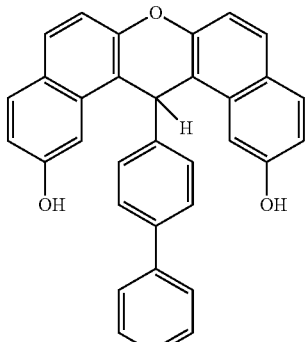
(5b1)
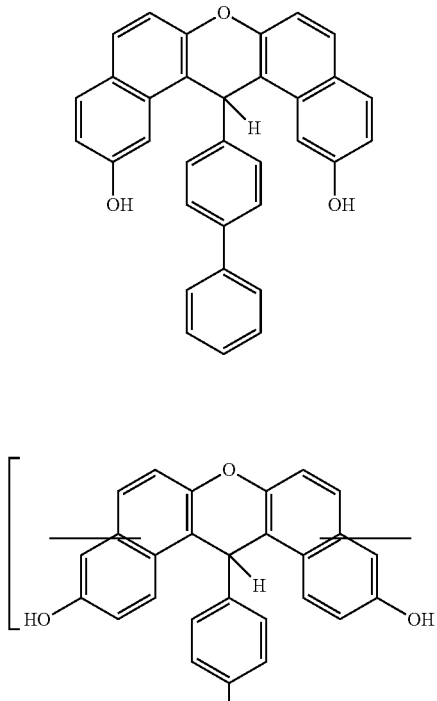
(5a)
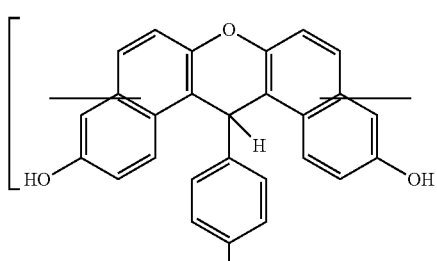
(5b2)
Specific, non-limiting examples of repeat unit B can be chosen from ones having structure (6) derived from monomers having structure (6a), where $R_3$ and $R_4$ are independently hydrogen or $C_1$-$C_8$ alkyl,
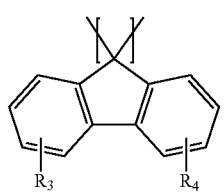
(6)

(6a)

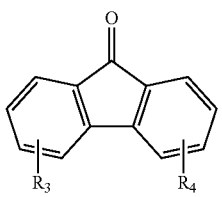

Non limiting examples of monomer 2a used to form repeat unit B having general structure (2) are as follows:

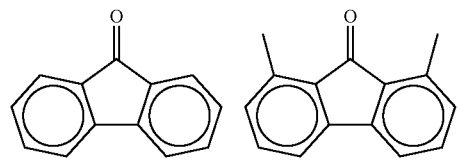

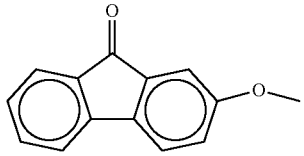

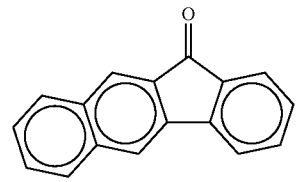

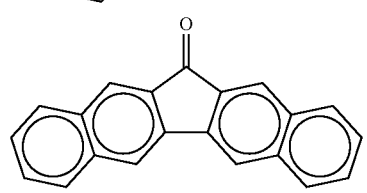

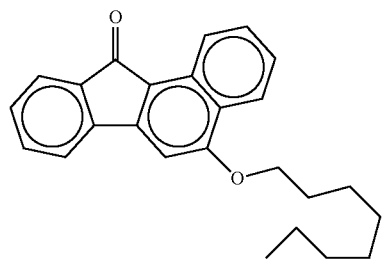

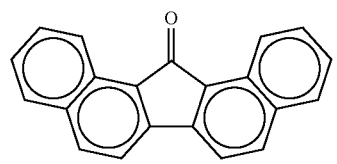

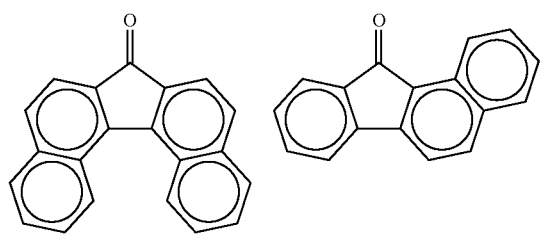

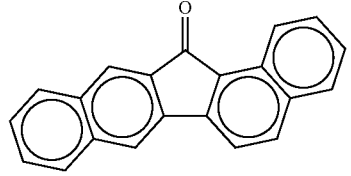

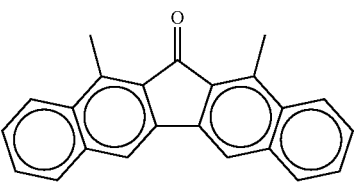

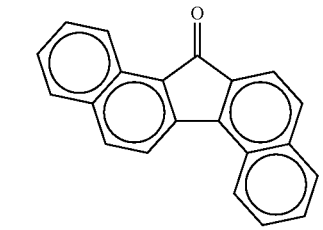

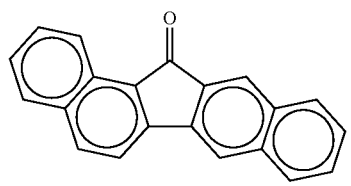

A specific non-limiting example of repeat unit B is structure (7), which is derived from a monomer having structure (7a) (9-Fluorenone).

(7)

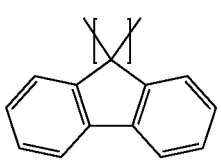

(7a)

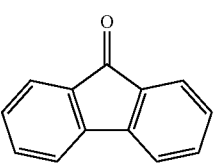

Specific, non-limiting examples of repeat unit C can be chosen from ones having structure (8) derived from monomers having structure (8b), wherein $R_5$ and $R_6$ are independently hydrogen, $C_1$-$C_8$ alkyl or $C_1$-$C_8$ alkoxy.

(8)

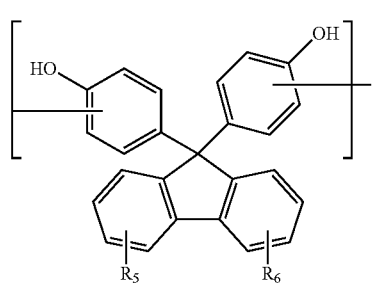

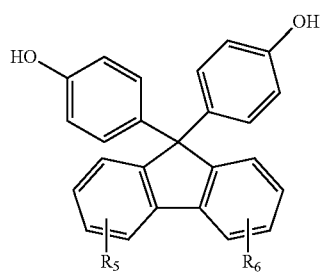
(8a)
Further, non-limiting examples of monomers 8a used to form repeat unit C having general structure (3) are as follows:
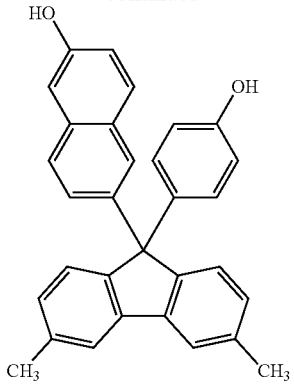
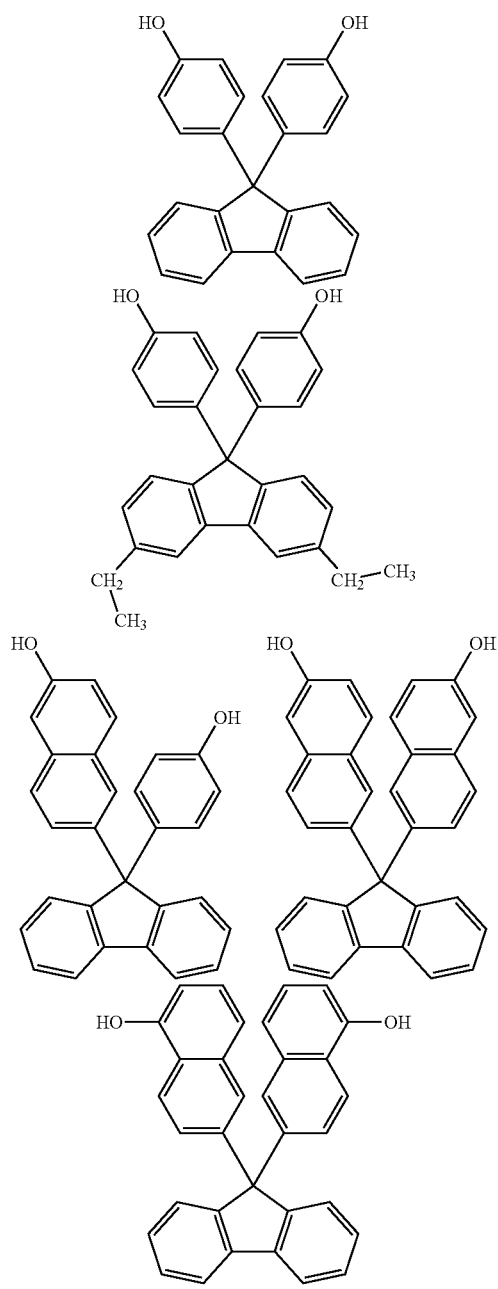
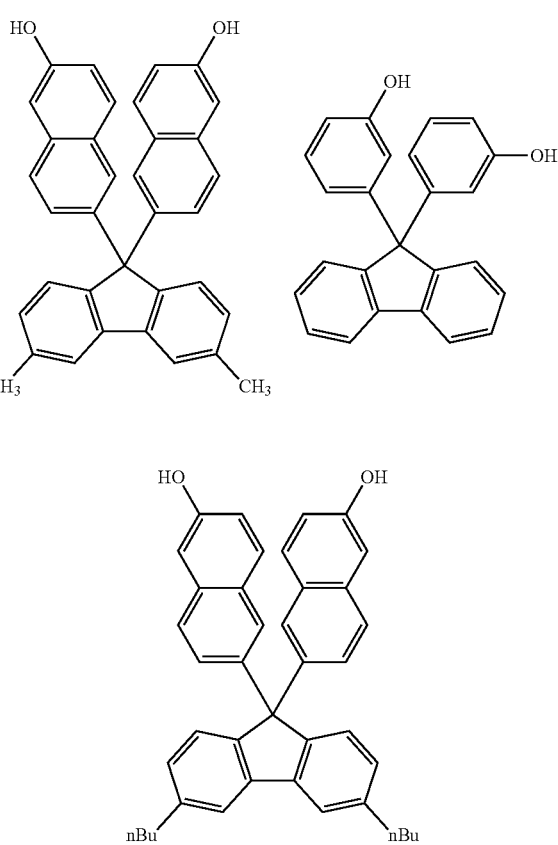
A specific non-limiting example of a repeat unit C has structure (9), which is derived from the monomer having structure (9a)[9,9-bis(4-hydroxyphenyl)fluorene (BHPF)].
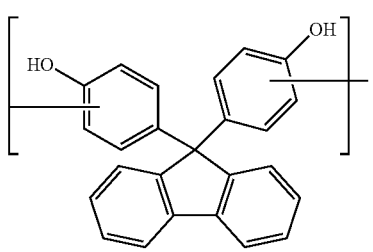
(9)

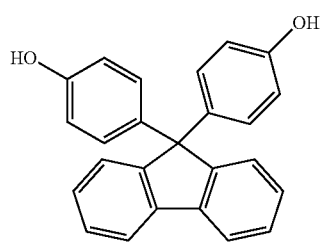

(9a)

More specifically, the novel polymer may be obtained by a condensation reaction of a monomer of general structure (Ia) which is a 14H-Dibenzo[a,j]xanthene-3,11-diol derivative with a monomer of general structure (2a) which is a 9H-Fluoren-9-one derivative and a monomer of general structure (3a) which can be, for instance, either a dihydroxy derivative of 9H-Fluorene, 9,9-diphenyl derivative or dihydroxy derivative of 9H-Fluorene,9,9-dinaphthyl, in the presence of an acid catalyst.

While not bound by theory, the hydroxyl substituted aromatic rings in monomers of structure (1a) and monomers of structure 3a) provides electron rich reactive sites for electrophilic substitution. The carbonyl group, in monomers of structure 2a, when protonated by a strong acid catalyst, provides an electrophile which may attack directly to form a carbon-carbon with the monomers of structure (1a) or (3a), or attack indirectly through the intermediacy of a co-catalyst such as a thiol compound. Monomer derivatives of structure (1a) and 3(a) each have at least two or more sites for electrophilic attack. Consequently, by subsequent protonation by the acid catalyst, a single monomer of structure (2a) can electrophilically attack two times on different monomers of structure (1a) or (3a) to form a carbon-carbon bonds with these monomers. Linear structures are possible when no more than two monomers of structure 2a electrophilically attack either a monomer of structure (1a) or a monomer of structure (3a). Branching is possible when more than 2 monomers of structure 2a electrophilically attack either a monomer of structure (1a) or a monomer of structure (3a).

The polymerization reactions are catalyzed in the presence of any strong acid having a pH lower than 0, for example sulfonic acids, bis(fluorinatealkylmides)[e.g. bis(perfluorobutyl)imide], tris(fluorinatedalkyl)-carbides [e.g. tris(perfluoroethyl)methane] or other strong nonnucleophilic acids. Non limiting examples of suitable sulfonic acids are methane sulfonic acid, triflic acid, and nonafluorobutane sulfonic acid. A secondary catalyst such as a thiol compound or a thiol compound derivative may be used in addition to the strong acid to promote the condensation reaction. Non limiting examples of suitable thiol derivatives are alkyl thiols (e.g. butyl thiol), thioalkylcarboxylic acids (e.g. 3-mercaptopropionic acid), and hydroxyalkylthiols (e.g. 3 mercaptopropanol).

The reaction may be carried out with or without a solvent. If a solvent is used, then any solvent capable of dissolving the solid components may be used, especially one which is nonreactive towards strong acids; solvents such as chloroform, bis(2-methoxyethyl ether), nitrobenzene, methylene chloride, dichroloethane, and triglyme, di(ethyleneglycol)dimethylether, di(propyleneglycol)dimethylether, di(propyleneglycol)diethyl ether, propylene glycol monomethy ether acetate (PGMEA), and propylene glycol. The reaction may be mixed for a suitable length of time at a suitable temperature, till the polymer is formed. The reaction time may range from about 1 hour to about 14 hours, and the reaction temperature may range from about 35° C. to about 180° C. The polymer is isolated and purified in appropriate solvents, such as methanol, hexane or heptane through precipitation and washing. The novel polymer may be fractionated to obtain a fraction with the desired molecular weight. The polymer is dissolved in a solvent, for example tetrahydrofuran (THF); a nonsolvent is added to the solution such as an alkane; and a precipitate is formed and filtered. The process of fractionation may be carried out at room temperature. The polymer may be further purified. Typically the low molecular weight portion is removed. Previously known techniques of reacting, isolating and purifying the polymer may be used. The weight average molecular weight of the polymer can range from about 500 to 20,000 or 500 to 10000 or 1000 to about 5,000, or about 1300 to about 3,000 or about 1,500 to about 2,600.

In the novel polymer the repeat unit A derived from a general structure (Ia) which is a 14H-Dibenzo[a,j]xanthene-3,11-diol derivative can be between 35 and 20 mole %, repeat unit B derived from a monomer of general structure (2a) which is a 9H-Fluoren-9-one derivative can be between 65 and 45 mole %, repeat unit C which is can be derived either a dihydroxy derivative of 9H-Fluorene, 9,9-diphenyl derivative or dihydroxy derivative of 9H-Fluorene,9,9-dinaphthyl can be between 35 and 20 mole %.

In another embodiment, repeat unit A can be between 30-22 mole %, repeat unit B can be between 60 and 48 mole %, and repeat unit C can be between 30 and 22 mole %. In another embodiment, repeat unit A can be between 28 and 22 mole %, repeat unit B can be between 55 and 48 mole %, repeat unit C can be between 28 and 22 mole % of the total amount of repeat units.

The novel polymer of the present invention retains a high carbon content even after a 400° C. bake. For instance, in one embodiment, the carbon content of the polymer or composition after crosslinking is greater than 80 weight %. In another embodiment it is greater than 85 weight %. In a further embodiment it is greater than weight 90%. In another embodiment, the carbon content of the polymer after crosslinking is in the range of about 80-95 weight %.

The polymer of the present novel composition may have the linear structural repeat unit as shown in structure (10), where D is a direct valence bound or a $C(R_1)(R_2)$ methylene moiety and where $R_1$ and $R_2$ are independently H, $C_1$-$C_8$ alkyl, $C_3$-$C_{24}$ cycloalkyl or $C_6$-$C_{24}$ aryl; $Ar^i$, $Ar^{ii}$, $Ar^{iii}$ and $Ar^{iv}$ are independently phenylenic or naphthalenic multivalent moieties derived respectively from benzene or naphthalene, $R_3$ and $R_4$ are independently hydrogen, $C_1$-$C_8$ alkyl or $C_1$-$C_8$ alkoxy, $R_5$ and $R_6$ are independently hydrogen, a $C_1$-$C_8$ alkyl or a $C_1$-$C_8$ alkoxy.

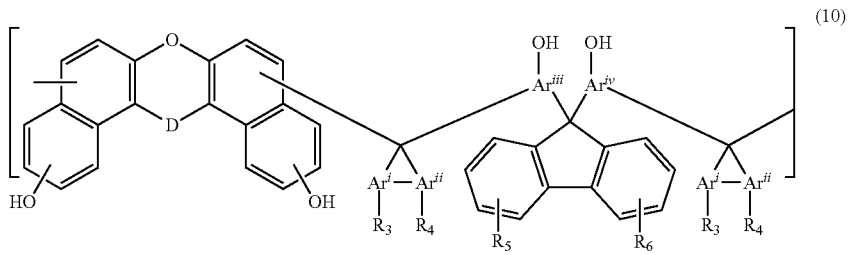

(10)

The polymer of the present novel composition may more specifically have the structural repeat unit as shown in structure (11) where $R_1$ and $R_2$ are independently H, $C_1$-$C_8$ alkyl, $C_3$-$C_{24}$ cycloalkyl or $C_6$-$C_{24}$ aryl, $R_3$ and $R_4$ are independently hydrogen, $C_1$-$C_8$ alkyl or $C_1$-$C_8$ alkoxy, $R_5$ and $R_6$ are independently hydrogen, $C_1$-$C_8$ alkyl or $C_1$-$C_8$ alkoxy.

diacetone alcohol; lactones such as butyrolactone; an amide derivative such as dimethylacetamide or dimethylformamide, anisole, and mixtures thereof. In one embodiment such solvents or mixtures of these solvents as described above are employed to dissolve all the components of the novel composition including optional additives, to produce a solution of

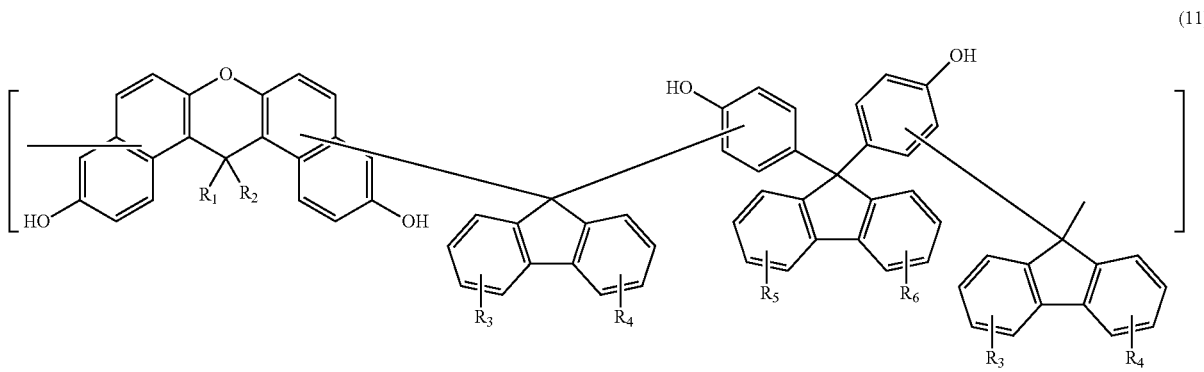

(11)

As previously discussed, it is possible to also form branched structures, and thus branched repeat unit analogous to either structure (10) or (11) are anticipated where more than two carbon carbon bonds are formed on either the monomers of structure 1a or 3a susceptible to electrophilic attack.

The solid components of the antireflective coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or about 5 to 50 wt %. In another embodiment the wt % of the solution may range from 10 to 30%. In a further embodiment the wt % may range from 10 to 20%.

In one specific embodiment of the novel composition, it comprises the novel polymer and a solvent. When coated on a wafer and baked at temperatures higher than 400° C., the novel polymer will crosslink so that it may be subsequently over coated by other layers such as a photoresist film.

Additives may be helpful in crosslinking at lower temperatures the composition comprising the novel polymer and a solvent, when it is coated on substrate during the post applied bake process. Examples of such components are crosslinkers or thermal acid generators. Another embodiment of the novel composition comprises the novel polymer, a solvent and either a crosslinker and/or a thermal acid generator.

Typical examples of a suitable crosslinker is a compound that can act as an electrophile and can, alone or in the presence of an acid, form a carbocation. Thus compounds containing groups such as alcohol, ether, ester, olefin, methoxymethylamino, methoxymethylphenyl and other molecules containing multiple functional groups, which can form a carbocation are capable of crosslinking with the polymer. Polymeric crosslinkers may be used, such as polymers of glycoluril, melamine, etc., such as those disclosed in U.S. Pat. No. 7,691,556. Examples of compounds which can be crosslinkers are, 1,3-adamantane diol, 1,3,5-adamantane triol, polyfunctional reactive benzylic compounds, tetramethoxymethyl-bisphenol (TMOM-BP) of structure (12), aminoplast crosslinkers, glycolurils, Cymels, Powderlinks, and MX 270 (13).

One or more of the above described crosslinkers may be employed in a composition.

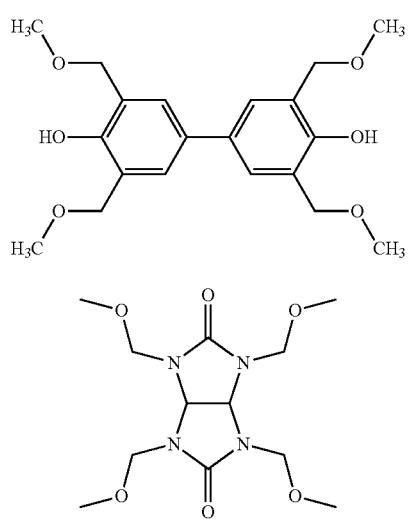

(12)

(13)

A typical examples suitable thermal acid generators (TAG) are compounds capable of generating a strong acid (pH<2) upon heating. Examples of a such a thermal acid generator (TAG) useful in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylalkylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diaryliodonium bis(fluoroalkylsulfonyl)imide, diaryliodonium quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. No. 3,474,054, U.S. Pat. No. 4,200,729, U.S. Pat. No. 4,251,665 and U.S. Pat. No. 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

Optionally, the formulation may further contain at least one of the known photoacid generators, examples of which without limitation are onium salts, sulfonate compounds, nitrobenzyl esters, triazines, etc. The preferred photoacid generators are onium salts and sulfonate esters of hydoxyimides, specifically diphenyl iodonium salts, triphenyl sulfonium salts, dialkyl iodonium salts, triakylsulfonium salts, and mixtures thereof. These photoacid generators are not necessarily photolysed but are thermally decomposed to form an acid.

As previously, discussed another optional additive is a free monomer of structure 1a or other substructure of this monomer as discussed above. This monomer is helpful in improving planarity of coating on patterned substrates, while maintaining other beneficial properties of the novel coating composition. A single type of monomer structure may be employed as an additive, or a mixture of different monomers having structure 1a. The monomer additive may be chosen from any of the monomers of structure 1a previously described as suitable for the terpolymerization leading to the novel polymer of this invention. In one embodiment of this concept, monomers having structures 1C1 to 1D11, 1a3, 1a4, 1b1, 1b4, 1b5, 4a, 4d, 4e, 5b1, or 5b2 may be chosen. In one embodiment of this concept the monomers of structures 1a may present in the range of 5-70% of the total weight of the combined weight of the novel polymer and monomer. In another embodiment it is present from 10-60%. In a further embodiment it is present from 15-55%. In another embodiment it is present from 20-50%. In another embodiment it is present from 30-50%. Apart, from the improvement to planarization imparted by this optional additive, it also unexpectedly maintained the low outgassing observed in formulations without it. This is unexpected because the addition of a low molecular weight additive, such as monomers of structure 1a, could have increased the tendency to outgas, particularly at higher bake temperature such as 400° C.

The antireflective coating composition may comprise other components to enhance the performance of the coating, e.g. monomeric dyes, lower alcohols ($C_1$-$C_6$ alcohols), surface leveling agents, adhesion promoters, antifoaming agents, etc. Examples of surfactants or leveling agents can be polyethylene glycol dodecyl ether, polyoxyethylene oleyl ether, polyethylene glycol octadecyl ether, polyethylene glycol tert-octylphenyl ether, fluorine based surfactant, and silicon based surfactant. Surfactants with the following trade names may be used, Brij30, Brij52, Triton X-100, FC4430, KP341, Tween 80 and the like.

In different embodiments, the novel polymer of the present invention may comprise about 30 to about 100 wt % of total solids in the novel composition of this invention, or about 40 to about 95 weight %, or about 50 weight % to about 95 weight %, or about 60 weight % to about 95 weight %, or about 70 weight % to about 95 weight % or about 80 weight % to about 95 weight %.

The crosslinker, when used in the composition, may be present at about 1 weight % to about 30 weight % of total solids. The thermal acid generator may be incorporated in a range from about 0.1 to about 10 weight % by total solids of the antireflective coating composition, or from 0.3 to 5 weight % by solids, and or about 0.5 to 2.5 weight % by solids.

The antireflective coating composition is coated on the substrate using techniques well known to those skilled in the art, such as dipping, spin coating or spraying. The film thickness of the antireflective coating ranges from about 50 nm to about 2000 nm. The coating is further heated on a hot plate or convection oven for a sufficient length (30-240 sec) of time to remove any residual solvent and induce crosslinking, and thus insolubilizing the antireflective coating to prevent intermixing between the antireflective coating and the layer to be coated above it. The range of temperature for this after apply coating bake is from about 90° C. to about 500° C., or more specifically 120° C. to about 450° C.

After this initial after apply baking step, a second optional bake of this coated film may be performed prior to overcoating with the photoresist between 230° C. and 450° C. for 30 to 240 seconds.

Since the antireflective film is coated on top of the substrate and is also subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The carbon content of the novel composition or polymer, after coating and baking to crosslink it on a substrate, is high, even after baking at temperature of 400° C. or higher. Specifically, the carbon content of the polymer or composition, after crosslinking, is in the range of 75 to 95% weight %. More specifically in the range of about 80-90 weight % carbon.

The extinction coefficient (k) values of the novel composition when coated and baked ranges from about 0.05 to about 1.0, preferably from about 0.1 to about 0.8 at the exposure wavelength. In one embodiment the composition has a k value in the range of about 0.2 to about 0.5 at the exposure wavelength. The refractive index (n) of the antireflective coating is also optimized and can range from about 1.3 to about 2.0, preferably 1.5 to about 1.8. Typically for 193 nm the preferred range for k is about 0.05 to about 0.75, and for 248 nm the preferred range for k is about 0.15 to about 0.8. In filling patterned substrate topography this second optional bake may be useful in maximizing flow of the antireflective coating so as to maximize its ability to fill the substrate topography and minimize reflection issues from the underlying topography when imaging the resist overcoating the novel antireflective coating of this invention. This secondary bake may also improve crosslinking of the antireflective coating, and may also allow for further removal of any residual solvents remaining in the film.

This invention also relates to a process for forming an image using the novel antireflective coating composition. The process is especially useful for imaging photoresists using radiation in the deep and extreme ultraviolet (uv) region.

The invention further relates to a process for employing the coating composition to form an image. The process for forming an image comprises providing a substrate with a first layer of the novel antireflective composition carbon hard mask of the present invention, as described above; optionally, providing at least a second antireflective coating layer over the first antireflective coating composition layer; coating a photoresist layer above the antireflective coating layer(s); imagewise exposing the photoresist layer with radiation; and developing the photoresist layer with an aqueous alkaline developing solution. This process may be employed with photoresist which is imageable with radiation from about 240 nm to about 12 nm.

The substrate may be provide with a coating with a first layer of the novel antireflective composition of the present invention, by using spin coating, spray coating, blade coating, or other coating procedures know to those practiced in art. After the substrate is provided with a coating it may be post applied baked with a single bake at a temperature between about 90° C. to about 400° C. for 30 to 240 seconds or about 60 to 120 seconds. After this single post applied bake a second post applied bake may also be applied. a) a single post applied bake between about 90° C. to about 400° C. is used when providing the first layer of an antireflective coating.

Other types of antireflective coatings may be coated above the coating of the present invention to form a second layer. Typically, an antireflective coating which has a high resistance to oxygen etching, such as one comprising silicon groups, such as siloxane, functionalized siloxanes, silsesquioxanes, or other moieties that reduce the rate of etching, etc., is used so that the coating can act as a hard mask for pattern transference. The silicon coating composition can be spin coatable or chemical vapor deposited. In one embodiment the substrate is coated with a first film of the novel composition of the present invention and a second coating of another antireflective coating comprising silicon is coated above the first film. The second coating can have an extinction coefficient (k) in the range of about 0.05 and 0.5. A film of photoresist is then coated over the second coating. The imaging process is exemplified in FIG. 1.

A film of photoresist is coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process. The photoresist is imageable with radiation from about 240 nm to about 12 nm.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference. Photoresists sensitive at 157 nm, and based on fluorinated polymers are known to be substantially transparent at that wavelength and are described in U.S. Pat. No. 6,790,587, U.S. Pat. No. 6,849,377, U.S. Pat. No. 6,818, 258, and U.S. Pat. No. 6,916,590. Photoresists that absorb extreme ultraviolet radiation (EUV) of 13.5 nm are also useful and are known in the art. The novel coatings can also be used in nanoimprinting and e-beam lithography.

After the coating process, the photoresist is imagewise exposed with a mask. The exposure may be done using typical exposure equipment. Examples of exposure wavelength sources are 248 nm, 193 nm and extreme ultraviolet, although any source may be used. The exposed photoresist is then developed in an aqueous developer to remove the treated photoresist. The developer is preferably an aqueous alkaline solution for example, tetramethyl ammonium hydroxide (TMAH), such as 0.26N aqueous TMAH solution. The developer may further comprise surfactant(s). An optional heating step can be incorporated into the process prior to development and after exposure. The photoresist may be imaged by ebeam to form a pattern or a pattern may be imprinted.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

Examples

Tokyo Electron Clean Track Act 8 was used for coating and baking of samples. The refractive index (n) and the extinction coefficient (k) were measured by ellipsometry.

The weight average molecular weight (Mw) and number average molecular weight (Mn) of the polymers were measured by Gel Permeation Chromatography (GPC) calibrated with polystyrene standards and polydispersity (Mw/Mn) is calculated therefrom.

Chemicals 9-fluorenone and 9,9-bis(4-hydroxyphenyl)fluorene (BHPF) were obtained from TCI America, 3,11-DBDX (14-[1,1'-biphenyl]-4-yl-14H-Dibenzo[a,j]xanthene-3,11-diol) was obtained from Mitsubishi Gas Chemical Co. AZ ArF Thinner and AZ® EBR 70/30 were obtained from AZ Electronic Materials, 70 Meister Ave., Somerville, N.J. All other chemicals unless otherwise noted were obtained from the Sigma-Aldrich Co.

Outgassing

Outgassing of Formulations during bake was measured using Quartz Crystal Microbalance. The quartz detector was set up above the hotplate, silicon wafers were coated with a sample and baked. During bake, the frequency was monitored and converted to the weight using Sauerbrey's equation. Formulation was coated at 400 nm thickness on 6 inch wafer and baked at 250° C. for 60 sec. The weight of outgas material collected from 20 coated wafers are shown in Table 2.

TGA and Elemental Analysis

Samples of polymer solution in PGMEA (15 wt %) or Formulations were spin coated on silicon wafers at 1500 rpm, baked with the indicated condition, the collected powered by scrapped off and used for TGA and elemental analysis.

VIA Filling and Planarization Experiments

To evaluate the ability of Formulations to fill topographic feature on patterned substrates and to planarize these substrates, both substrates patterned with Via's and Line and Space patterns were evaluated as follows: Formulations were coated at 250 nm thickness on a silicon wafer with 600 nm depth Via patterns and baked at 240° C./60 sec, or formulations were coated at a thickness of 150 nm on silicon wafers with line and space patterns having a height of 100 nm and baked at 240° C./60 sec. Film thicknesses were adjusted by spin speed and dilution of the formulations with the solvent. The Via and line patterns were inspected by Scanning Electron Microcope (SEM).

Synthesis of Polymer 1

Synthesis of Terpolymer of 9-Fluorenone, BHPF and 3,11-DBDX

9-Fluorenone (10 g, 0.0558 mol), BHPF (9.8 g, 0.0279 mol), 3,11-DBDX (13.0 g, 0.0279 mol) and 125 ml of 1,2-dichloroethane were charged into a 250 mL 4neck flask under nitrogen. After dissolution was confirmed, 3-mercaptopropionic acid (0.3 mL, 0.0028 mol) and methanesulfonic acid (2.0 ml) were added drop wise under nitrogen and refluxed at 100° C. for 9 hrs. After the reaction was complete, the viscous mixture was diluted with 300 ml ethyl acetate and then transferred to separating funnel where it was washed with DI water 5 times and separated. Water washing was continued until the water layer became neutral. The organic layer was evaporated at 60-70° C. to remove solvent and obtain a residue. Then, 100 ml tetrahydrofuran was added to the residue and the polymer was isolated by precipitation into 1300 ml hexane, this precipitation was repeated one more time to obtain the purified precipitated polymer wish was dried in a vacuum oven overnight at 80° C. GPC (Mw 2488, Mw/Mn 1.74); Elemental Analysis (% C, 88.86; % H, 4.69), TGA (8.534 wt % loss at 400° C.). This polymer was very soluble in spin casting solvents such as PGMEA and AZ® EBR 70/30 (at least 15 wt %).

Formulation 1a

A solution was prepared by mixing the polymer in Example 1 (3.00 g), and 17.00 g of PGMEA. After complete mixing, the solution was filtered through a 0.02 µm filter and used for solvent resistance test.

Formulation 1b

A solution was prepared by mixing the polymer in Example 1 (5.2632 g), 3,3',5,5'-tetrakis(methoxymethyl)-[(1, 1-biphenyl)-4,4'-diol] (0.5263 g), a 10 wt % PGMEA solution of triethylammonium dodecylbenzenesulfonate (2.1053 g), and 32.1053 g of PGMEA. After complete mixing, the solution was filtered through a 0.02 µm filter and used for TGA experiments.

Process Example 1a

Solvent Resistance of Formulation 1a

Formulation 1a was spin-coated on an 8" silicon wafer and baked at 450° C. for 60 sec resulting in a 400 nm thick film. This film was treated with PGMEA for 10 sec and showed no significant thickness loss. This showed that a crosslinker is not essential to impart insolubility.

Process Example 1b

Elemental Analysis of Formulation 1b

Formulation 1 b was spin-coated on an 8" silicon wafer and baked at 230° C. for 60 sec. The coated material was scraped out from the wafer surface by a blade and elemental analysis was done. In the same way, Formulation 1 b baked at 400° C. for 120 sec and elemental analysis was done. The results are shown in the Table 1. Also, the film spun and baked as described above at 2 different temperatures, did not show any significant thickness loss when treated with PGMEA for 10 sec.

TABLE 1

| Formulation 1b | C (%) | H (%) | O (%) |
|---|---|---|---|
| Baked at 230° C. for 60 sec | 86.22 | 4.67 | 9.11 |
| Baked at 400° C. for 120 sec | 83.03 | 3.84 | 13.13 |

Formulation 2

A solution was prepared by mixing Polymer 1 (2.6316 g), 3,3',5,5'-tetrakis(methoxymethyl)-[(1,1'-biphenyl)-4,4'-diol] (0.2632 g), a 10 wt % PGMEA solution of triethylammonium dodecylbenzenesulfonate (1.0536 g) and 26.0526 g of PGMEA. After complete mixing, the solution was filtered through a 0.02 μm filter and used for via filling experiments.

Process Example 2 with Formulation 2

Via filling of Formulation 2 was tested as described above. SEM cross sections showed that 100 nmVias (pitches 1000 nm, 250 nm and 200 nm) were completely filled with the Formulation 2, and no visible pinholes, voids or other defects was observed.

Formulation 3

A solution was prepared by mixing Polymer 1 (2.6316 g), 3,3',5,5'-tetrakis(methoxymethyl)-[(1,1'-biphenyl)-4,4'-diol] (0.2632 g), a 10 wt % PGMEA solution of triethylammonium dodecylbenzenesulfonate (1.0536 g) and 26.0526 g of PGMEA. After complete mixing, the solution was filtered through a 0.02 μm filter and used for outgassing experiment.

Process Example 3 with Formulation 3

Outgassing and elemental analyses of Formulation 3 were conducted as described above. The results are summarized in Table 2.

Synthesis of Comparative Polymer 1C

Synthesis of copolymer of 9-fluorenone and 1,1'-bi-2,2'-naphthol 9-fluorenone (10 g, 5.6 mmol), 1,1'-bi-2,2'-naphthol (15.9 g, 15.9 moml), and 125 ml of 1,2-dichloroethane were taken in a three necked flask and stirred on heating for 20 minutes to make a solution. Then 0.3 ml of 3-mercaptopropionic acid and 3.0 ml of methanesulphonic acid were added drop wise. The heating and stirring was continued under reflux for 10 hours. At the end of reaction 300 ml of ethyl acetate was added at room temperature and was transferred to a separatory funnel and washed with water. Water washing was done several times until the washing was neutral. The organic layer was concentrated under reduced pressure to a residue. It was dissolved in 100 ml of tetrahydrofurane which was poured into 1300 ml of hexane to precipitate. The precipitate was collected by filtration and dried under vacuum. The copolymer obtained was analyzed by GPC, Mw 2370, Mw/Mn 1.89. Elemental analysis showed, carbon 86.81%, hydrogen 4.58%, and oxygen 9.29%.

This polymer did not dissolve in PGMEA or AZ® EBR 70/30.

Synthesis of Comparative Polymer 2C

Synthesis of Copolymer of 9-Fluorenone and 3,11-DBDX

The copolymerization of 9-Fluorenone and 3,11-DBDX was done following the procedure of Synthetic example 1. The isolated polymer obtained in this manner had the following properties, Mw 1285, Mw/Mn 1.32, DSC-Tg=186.41° C., TGA (15 wt % loss). The Mw of this material which represents the polymerization of a monomer of type 1a with 2a gave a lower Mw and higher TGA wt loss than the terpolymers 9-Fluorenone, BHPF and 3,11-DBDX such as Synthetic Polymer Example 1.

Comparative Formulation 2C

A solution was prepared by mixing the comparative Polymer 2C using the same loadings of the other components and process as described for formulation 1. The filtered solution was spin-coated at 1500 rpm and the coated wafer was baked at 250° C. for 60 sec. During the bake a clear white smoke was observed, indicative of high outgassing. This smoke was not observed for the terpolymers of monomers of type 1a, 2a and 3a, for example, in Polymer 1. Table 2 shows that this qualitative visual observation is consistent with the amount of outgassing quantitatively measured.

Comparative Process Example 1 with Comparative Formulation 1C

Outgassing and elemental analysis of Comparative Formulation 1C were evaluated as described above. The results are summarized in Table 2.

Synthesis of Comparative Polymer 3C

Terpolymer of Anthracenemethanol, Divinylbenzene, and BHPF

A solution was prepared under nitrogen consisting of 42.5 g (025 mol) 2-phenylphenol, 104.1 g (0.5 mol) 9-Anthracenemethanol, 65.1 g (0.5 mol) divinylbenzene, and 85.6 g (0.25 mol) BHPF dissolved in 200 g cyclopentyl methyl ether (CPME) and 700 g diethylene glycol dimethyl ether (DEGME) and the mixture was stirred for 10 minutes in a 3 Liter, 4 neck flask equipped with an overhead mechanical stirrer, condenser, thermo watch, Dean Stark trap and a nitrogen purge. After this time, 4.5 g of triflic acid (1.5% wt of monomers) was added to the stirred mixture and it was stirred for another 10 minutes. The temperature of the stirred mixture was then raised to 140° C. and heated for 3 hours. After cooling the reaction mixture and diluting it with 400 mL of CPME, it was transferred to a separating funnel, and washed with two aliquots of deionized (DI) water (2×400 mL), and was precipitated by drowning into hexane. The polymer was filtered, washed and dried under vacuum. The polymer was dissolved in THF again and isolated using hexane one more time to remove all monomer and oligomers. The weight average molecular weight of the polymer was 1918 and polydispersity (Mw/Mn) of 1.78. Elemental analysis gave Carbon 88.99% and Hydrogen 5.89%, TGA (26.345% weight loss at 400° C.). The weight loss of this copolymer was much higher than that observed for the terpolymer of 9-Fluorenone, BHPF and 3,11-DBDX described in Polymer 1(8.534 wt % loss at 400° C.).

Comparative Formulation 2C

The comparative Polymer 3C (8.9123 g), 3,3',5,5'-tetrakis (methoxymethyl)-[(1,1'-biphenyl)-4,4'-diol] (0.8912 g), a 10 wt % PGMEA solution of triethylammonium dodecylbenzenesulfonate (3.5649 g) were mixed with 50.1316 g of PGMEA. After dissolving the components, the solution was filtered through a 0.02 μm filter.

Comparative Process Example 2 with Comparative Formulation 2C

Outgas and elemental analysis of Comparative Formulation 2C were evaluated as described above. The results are summarized in Table 2.

TABLE 2

| Formulation | Polymer | Additive | Outgas 250° C./60 s | Carbon (%) 400° C./120 s |
|---|---|---|---|---|
| Formulation 3 | Polymer 1 | None | 1.85 μg/cm² | 83.0 |
| Formulation 4 | Polymer 2 | 3,11-DBDX (35%) | 1.90 μg/cm² | 83.0 |
| Formulation 8 | Polymer 2 | 3,11-DBDX (40%) | 1.80 μg/cm² | 83.0 |
| Comp. Formulation 1C | Comp. Polymer 2C | None | 3.81 μg/cm² | — |
| Comp. Formulation 2C | Comp. Polymer 3C | None | 8.8 μg/cm² | 80.3 |
| Comp. Formulation 3C | Polymer 2 | BNF (40%) | 5.8 μg/cm² | — |

Synthesis of Polymer 2

Synthesis of Terpolymer of 9-Fluorenone, BHPF and 3,11-DBDX 9-fluorenone (10 g, 0.0558 mol), BHPF (9.8 g, 0.0279 mol), 3,11-DBDX (13.0 g, 0.0279 mol) and 250 g of dichloromethane were dissolved in a 250 mL flask under nitrogen gas. After dissolution was confirmed of 3-mercaptopropionic acid (1 g), trifluoromethyl sulfonic acid (2.5 ml) was added drop wise. The mixture was refluxed at temperature of 40° C. for 3 hr under nitrogen atmosphere. After the reaction, the viscous mixture was diluted with cyclopentyl methyl ether (200 ml) and then transferred to a separating funnel where it is washed with de-ionized water 5 times and separated. The organic layer was washed until the water layer becomes neutral. The organic layer was put into heptane (1600 ml) and the solid was isolated. The crude solid (15 g) was purified by dissolving in THF (38 g), precipitated into heptane-isopropanol (1:1, 47 g) and dried in a vaccum oven at 80° C. GPC (Mw 1899, Mw/Mn 1.29); Elemental Analysis (% C, 88.56; % H, 4.32).

Synthesis of Polymer 3

Synthesis of Terpolymer of 9-Fluorenone, BHPF and 3,11-DBDX 9-fluorenone (10 g, 0.0558 mol), BHPF (9.8 g, 0.0279 mol), 3,11-DBDX (13.0 g, 0.0279 mol) and 125 g of dichloromethane were dissolved in a 250 mL flask introducing nitrogen gas. After dissolution was confirmed of 3-mercaptopropionic acid (1 g), trifluoromethyl sulfonic acid (2.5 ml) was added drop wise. The mixture was refluxed at temperature of 40° C. for 3 hr under nitrogen atmosphere. After the reaction, the viscous mixture was diluted with dichloromethane (50 ml) and cyclopentylmethylether (50 ml) and then transferred to a separating funnel where it is washed with de-ionized water 5 times and separated. The organic layer was washed until the water layer becomes neutral. The organic layer was put into heptane (1400 ml) and the solid was isolated. The crude solid (2 g) was purified by dissolving it in THF (10 g), precipitated into isopropanol-deionized water (1:1, 20 g) and dried in a vacuum oven at 80° C. GPC (Mw 2537, Mw/Mn1.42); Elemental Analysis (% C, 88.38; % H, 4.28).

The polymers 2 and 3 were very soluble in PGMEA and AZ® EBR 7030 (at least 15 wt %). Also, these polymers when formulated as per Formulation Examples 1b gave low outgassing and had good via filling properties as was observed for Formulation Examples 1b itself with polymer 1. The polymers 1, 2 and 3 were also evaluated by adding a monomer of structure is (3,11-DBDX) as an additive. This additive improved planarization properties the results for these formulations (Formulations 7-11) are shown in Process Example 5.

Formulation 4

Polymer from Synthesis Example 2 with Added 3,11-DBDX

A solution was prepared by mixing Polymer 2 (1.026 g), 3,11-DBDX (0.553 g), 3,3',5,5'-tetrakis(methoxymethyl)-[(1,1'-biphenyl)-4,4'-diol] (0.158 g), a 10 wt % PGMEA solution of triethylammonium dodecylbenzenesulfonate (0.632 g) and 15.63 g of PGMEA. After complete mixing, the solution was filtered through a 0.02 μm filter.

Formulation 5

Polymer from Synthesis Example 3 with Added 3,11-DBDX

A solution was prepared dissolving Polymer 3 (1.026 g), 3,11-DBDX (0.553 g), 3,3',5,5'-tetrakis(methoxymethyl)-[(1,1'-biphenyl)-4,4'-diol] (0.158 g), a 10 wt % AZ ArF thinner solution of triethylammonium dodecylbenzenesulfonate (0.632 g) mixed with 15.63 g of AZ® ArF thinner. After complete mixing, the solution was filtered through a 0.02 μm filter.

The optical parameters of Formulation Examples 1, 5, 6, 10 and 11 are shown in Table 3.

TABLE 3

| Formulation # | Bake condition | n @ 193 nm | k @ 193 nm |
|---|---|---|---|
| 1 | 400° C./120 s | 1.379 | 0.572 |
| 5 | 400° C./120 s | 1.396 | 0.540 |
| 6 | 400° C./120 s | 1.386 | 0.538 |
| 10 | 400° C./120 s | 1.389 | 0.533 |
| 11 | 400° C./120 s | 1.389 | 0.528 |

Formulation 7

Polymer from Synthesis Example 2 with Added 3,11-DBDX

A solution was prepared dissolving Polymer 2 (1.074 g), 3,11-DBDX (0.461 g), 3,3',5,5'-tetrakis(methoxymethyl)-[(1,1'-biphenyl)-4,4'-diol] (0.153 g), a 10 wt % AZ ArF thinner solution of triethylammonium dodecylbenzenesulfonate (0.615 g) mixed with 47.69 g of AZ® ArF thinner, After complete mixing, the solution was filtered through a 0.02 μm filter.

Formulation 8

Polymer 2 with Added 3,11-DBDX

A solution was prepared by mixing Polymer 2 (0.921 g), 3,11-DBDX (0.614 g), 3,3',5,5'-tetrakis(methoxymethyl)-[(1,1'-biphenyl)-4,4'-diol] (0.153 g), a 10 wt % AZ ArF thinner solution of triethylammonium dodecylbenzenesulfonate (0.615 g) mixed with 47.69 g of AZ® ArF thinner. After complete mixing, the solution was filtered through a 0.02 μm filter.

Formulation 9

Polymer from Synthesis Example 2 with Added 3,11-DBDX

A solution was prepared by mixing Polymer 2 (0.768 g), 3,11-DBDX (0.768 g), 3,3',5,5'-tetrakis(methoxymethyl)-[(1,1'-biphenyl)-4,4'-diol] (0.153 g), a 10 wt % AZ ArF thinner solution of triethylammonium dodecylbenzenesulfonate70/30 (0.615 g) and 47.69 g of AZ® ArF thinner. After complete, mixing the solution was filtered through a 0.02 μm filter.

Formulation 10

Polymer from Synthesis Example 2 with Added 3,11-DBDX

A solution was prepared by mixing Polymer 2 (0.614 g), 3,11-DBDX (0.921 g), 3,3',5,5'-tetrakis(methoxymethyl)-[(1,1'-biphenyl)-4,4'-diol] (0.153 g), a 10 wt % AZ ArF thinner solution of triethylammonium dodecylbenzenesulfonate 70/30 (0,615 g) and 47.69 g of AZ® ArF thinner. After complete mixing, the solution was filtered through a 0.02 μm filter.

Formulation 11

Polymer from Synthesis Example 2 with Added 3,11-DBDX

A solution was prepared by mixing Polymer 2 (0.461 g), 3,11-DBDX (1.074 g), 3,3',5,5'-tetrakis(methoxymethyl)-[(1,1'-biphenyl)-4,4'-diol] (0.153 g), a 10 wt % AZ ArF thinner solution of triethylammonium dodecylbenzenesulfonate (0.615 g) and 47.69 g of AZ® ArF thinner. After complete mixing, the solution was filtered through a 0.02 μm filter.

Comparative Formulation 3C

Polymer from Synthesis Example 2 with Added BNF

A solution was prepared by mixing Polymer 2 (0.921 g), Bisnaphtholfluorene (0.614 g), 3,3',5,5'-tetrakis(methoxymethyl)-[(1,1)-biphenyl)-4,4'-diol] (0.153 g), a 10 wt % AZ ArF thinner solution of triethylammonium dodecylbenzenesulfonate (0.615 g) mixed with 47.69 g of AZ® ArF thinner. After complete mixing, the solution was filtered through a 0.02 μm filter.

Process Example 4

Via Filling with Formulations 4-6

Via filling of Formulation 4-6 was tested as described above. SEM cross sections showed that 100 nm Vias (pitches 100 nm, 250 nm, and 200 nm) were completely filled with the formulations 4, 5 & 6 respectively and no pinholes, voids or other defect was observed.

Process Example 5

Planarization with Formulations 3, 7-11

Planarization of Formulations 3, 7-11 was tested as described above. SEM cross sections showed that 55 nmL (Pitches 110 nm, 165 nm, 220 nm) were completely filled with formulations 3, 7, 8, 9, 10 & 11 respectively and planarized lines. No visible pinholes, voids or other defects were observed. Formulations 7, 8, 9, 10 & 11 with 3,11-DBDX showed better planarization than Formulation 3 without 3,11-DBDX.

Summary of Unexpected Results from the Examples

Comparative Polymer 10, which did not employ a monomer of formula 1a and only employed a monomer of structure 2a and a bisnaphthol monomer, was found to be totally insoluble in conventional spin casting solvents. This demonstrated the unexpected property of the terpolymer which results when a monomer of structure 1a was copolymerized with monomer of structure 2a and 3a which unexpectedly enhanced solubility while maintaining other desirable properties such as high carbon content, good antireflective properties, good via filling and low outgassing as seen in formulations made with the terpolymer of 9-fluorenone, BHPF and 3,11-DBDX (Polymer Example 1, 2 and 3). These terpolymers when formulated into crosslinking antireflective coatings had appropriate n and k values at 193 nm to impart good antireflective performance.

Another demonstration of this unexpected coupling of properties of the novel terpolymers of monomers of structure 1a, 2a and 3a was demonstrated by the properties of formulations based on comparative polymer 20. In this instance it was shown that when monomers of structure 1a (e.g. 3,11-DBDX) and 3a (e.g BHPF) were copolymerized together without a monomer of structure 2a, the reaction yields only an lower molecular weight polymer which has poor outgassing properties as shown as shown in Table 2.

It has also been demonstrated that by adding monomers of structure 1a such as 3,11-DBDX to crosslinking formulations containing terpolymers of 1a, 2a, and 3a (e.g. Formulations 4-11) these had good via filling, and planarizing properties (Process examples 4 and 5) while maintaining low outgassing. This low outgassing was unexpected because using a small molecule such as a monomer of structure 1a might have been expected to increase outgassing during post applied bakes.

The invention claimed is:
1. An antireflective coating composition comprising
i) a crosslinkable polymer comprising at least one repeat unit (A) having structure (1), at least one repeat unit (B) having a structure (2), and at least one repeat unit (C) having structure (3)

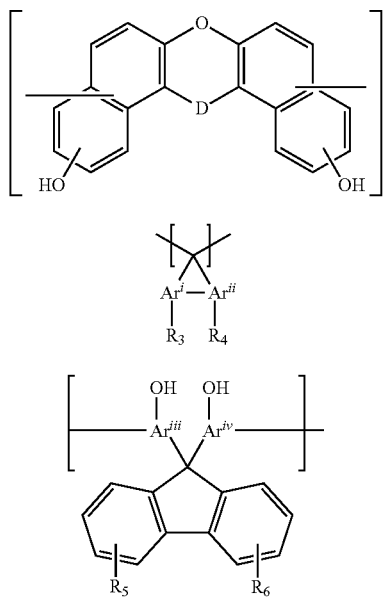

where D is a direct valence bond or a $C(R_1)(R_2)$ methylene moiety where $R_1$ and $R_2$ are independently H, $C_1$-$C_8$ alkyl, $C_3$-$C_{24}$ cycloalkyl or $C_6$-$C_{24}$ aryl; $Ar^i$, $Ar^{ii}$, $Ar^{iii}$ and $Ar^{iv}$ are independently phenylenic or naphthalenic moiety, $R_3$ and $R_4$ are independently hydrogen, $C_1$-$C_8$ alkyl or $C_1$-$C_8$ alkoxy; $R_5$ and $R_6$ are independently hydrogen, $C_1$-$C_8$ alkyl or $C_1$-$C_8$ alkoxy; and,
ii) a solvent.

2. The composition of claim 1, where repeat unit A has structure (1b) where $R_1$ and $R_2$ are independently H, $C_1$-$C_8$ alkyl, $C_3$-$C_{24}$ cycloalkyl or $C_6$-$C_{24}$ aryl,

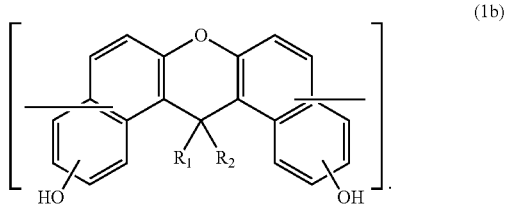

3. The composition of claim 1, where repeat unit A has structure (4) structure where $R_7$ is $C_6$-$C_{24}$ aryl

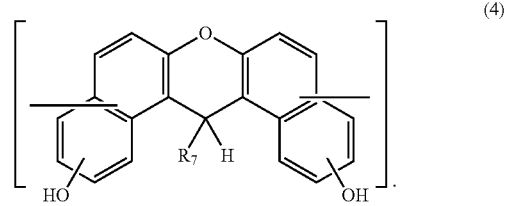

4. The composition of claim 1 where the repeat unit B has structure (6)

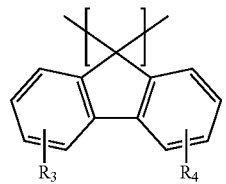

where $R_3$ and $R_4$ are independently hydrogen, $C_1$-$C_8$ alkyl or $C_1$-$C_8$ alkoxy.

5. The composition of claim 1 where the repeat unit C has structure (8)

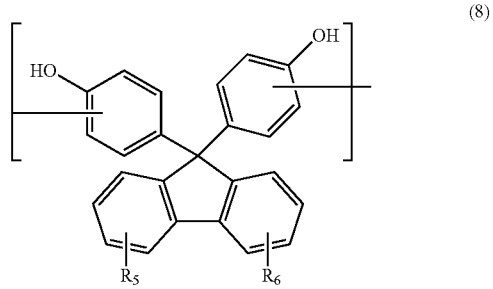

where $R_5$ and $R_6$ are independently hydrogen, $C_1$-$C_8$ alkyl or $C_1$-$C_8$ alkoxy.

6. The composition of claim 1, where the repeat unit A has structure structure 5a,

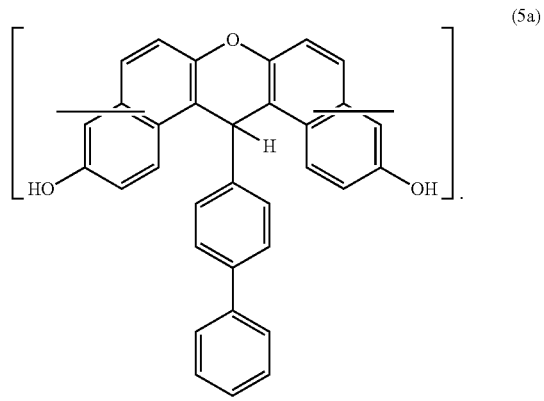

7. The composition of claim 1, where the repeat unit B has structure (7),

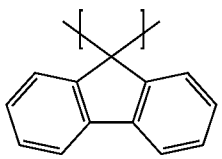

8. The composition of claim 1, where the repeat unit C has structure (9),

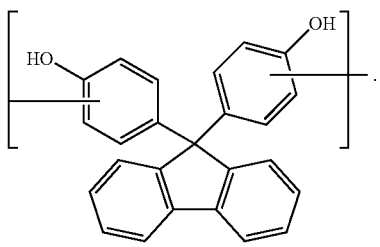

(9)

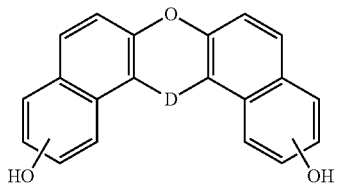

(1a)

9. The composition of claim 1, where the composition further comprises a photo acid generator.

10. The composition of claim 1 the antireflective coating further comprises a thermal acid generator.

11. The composition of claim 1, where the thermal acid generator chosen from ammonium, alkylammonium, dialkylammonium, trialkylammonium or tetraalkylammonium salts of strong non nucleophilic acids.

12. The composition of claim 1 further comprising a crosslinker.

13. The composition of claim 12 where the crosslinker is a crosslinker comprising multiple functional groups selected from the group consisting of esters, ethers, alcohols, olefins, methoxymethylamino, and methoxymethylphenyl.

14. The composition of claim 12 where the crosslinker is selected from a group consisting of 1,3-adamantane diol, 1,3,5-adamantane triol, polyfunctional reactive benzylic compounds, aminoplast crosslinkers, glycolurils and

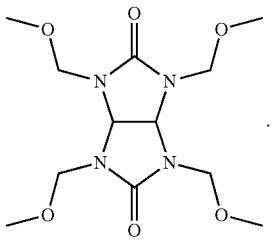

15. The composition of claim 1 further comprising a monomer of structure 1a where D is a direct valence bond or $C(R_1)(R_2)$ methylene moiety and where $R_1$ and $R_2$ are independently H, $C_1$-$C_8$ alkyl, $C_3$-$C_{24}$ cycloalkyl or $C_6$-$C_{24}$ aryl.

16. A process for forming an image, comprising;
   a) providing a substrate with a first layer of an antireflective coating composition from claim 1;
   b) optionally, providing at least a second antireflective coating layer over the first antireflective coating composition layer;
   c) coating a photoresist layer above the antireflective coating layers;
   d) imagewise exposing the photoresist layer with radiation;
   e) developing the photoresist layer with an aqueous alkaline developing solution.

17. The process of claim 16, where the photoresist is imageable with radiation from about 240 nm to about 12 nm.

18. The process of claim 16, where the second antireflective coating layer comprises silicon.

19. The process of claim 16, where the substrate is subjected to a single post applied bake between about 90° C. to about 500° C. after providing the substrate with the first layer of the antireflective coating composition.

20. The process of claim 19, where the substrate is subjected to a second post applied bake between 230° C. to about 450° C. after the single post applied bake.

* * * * *